United States Patent
Hsu et al.

(10) Patent No.: US 9,922,974 B2
(45) Date of Patent: Mar. 20, 2018

(54) SEMICONDUCTOR DEVICE AND METHOD FOR FABRICATING THE SAME

(71) Applicant: UNITED MICROELECTRONICS CORP., Hsin-Chu (TW)

(72) Inventors: Chia Chang Hsu, Kaohsiung (TW); Chun-Hsien Lin, Tainan (TW)

(73) Assignee: UNITED MICROELECTRONICS CORP., Hsin-Chu (TW)

( * ) Notice: Subject to any disclaimer, the term of this patent is extended or adjusted under 35 U.S.C. 154(b) by 0 days.

(21) Appl. No.: 15/641,336

(22) Filed: Jul. 5, 2017

(65) Prior Publication Data
US 2017/0301670 A1 Oct. 19, 2017

Related U.S. Application Data

(62) Division of application No. 14/873,223, filed on Oct. 2, 2015, now Pat. No. 9,748,233.

(30) Foreign Application Priority Data

Aug. 28, 2015 (TW) .............................. 104128258 A

(51) Int. Cl.
| | |
|---|---|
| H01L 27/088 | (2006.01) |
| H01L 29/66 | (2006.01) |
| H01L 21/02 | (2006.01) |
| H01L 21/768 | (2006.01) |
| H01L 29/40 | (2006.01) |
| H01L 21/8234 | (2006.01) |
| H01L 23/485 | (2006.01) |

(52) U.S. Cl.
CPC ........ *H01L 27/088* (2013.01); *H01L 21/0217* (2013.01); *H01L 21/02164* (2013.01); *H01L 21/02532* (2013.01); *H01L 21/02592* (2013.01); *H01L 21/76819* (2013.01); *H01L 21/76853* (2013.01); *H01L 21/76897* (2013.01); *H01L 21/823475* (2013.01); *H01L 23/485* (2013.01); *H01L 29/401* (2013.01); *H01L 29/66545* (2013.01)

(58) Field of Classification Search
None
See application file for complete search history.

(56) References Cited

U.S. PATENT DOCUMENTS

| | | | |
|---|---|---|---|
| 6,638,829 B1 * | 10/2003 | Cheek | ............... H01L 21/28079 257/E21.202 |
| 8,791,528 B2 | 7/2014 | Lin et al. | |
| 2002/0076866 A1 | 6/2002 | Cherng | |
| 2002/0132191 A1 | 9/2002 | Chuang | |
| 2003/0068885 A1 | 4/2003 | Cheong | |
| 2005/0258499 A1 | 11/2005 | Huang | |

(Continued)

OTHER PUBLICATIONS

Chien-Ting Lin, Title of Invention: Semiconductor Device and a Fabrication Method Thereof, U.S. Appl. No. 14/855,357, filed Sep. 15, 2015.

*Primary Examiner* — Michelle Mandala
(74) *Attorney, Agent, or Firm* — Winston Hsu

(57) ABSTRACT

A method for fabricating semiconductor device includes the steps of: providing a substrate having a gate structure thereon; forming a silicon layer on the substrate to cover the gate structure entirely; planarizing the silicon layer; and performing a replacement metal gate (RMG) process to transform the gate structure into a metal gate.

8 Claims, 3 Drawing Sheets

(56) References Cited

U.S. PATENT DOCUMENTS

2009/0256214 A1   10/2009  Sun
2012/0007051 A1*  1/2012  Bangsaruntip ......... B82Y 10/00
                                                             257/24
2016/0172356 A1*  6/2016  Cheng ................. H01L 27/0629
                                                             257/379

* cited by examiner

SEMICONDUCTOR DEVICE AND METHOD FOR FABRICATING THE SAME

CROSS REFERENCE TO RELATED APPLICATIONS

This application is a division of U.S. application Ser. No. 14/873,223 filed Oct. 2, 2015, and incorporated herein by reference in its entirety.

BACKGROUND OF THE INVENTION

1. Field of the Invention

The invention relates to a method for fabricating semiconductor device, and more particularly, to a method of forming amorphous silicon layer on one side of the gate structure and contact plug on another side of the gate structure.

2. Description of the Prior Art

With the trend in the industry being towards scaling down the size of the metal oxide semiconductor transistors (MOS), three-dimensional or non-planar transistor technology, such as fin field effect transistor technology (FinFET) has been developed to replace planar MOS transistors. Since the three-dimensional structure of a FinFET increases the overlapping area between the gate and the fin-shaped structure of the silicon substrate, the channel region can therefore be more effectively controlled. This way, the drain-induced barrier lowering (DIBL) effect and the short channel effect are reduced. The channel region is also longer for an equivalent gate length, thus the current between the source and the drain is increased. In addition, the threshold voltage of the FinFET can be controlled by adjusting the work function of the gate.

Typically, contact areas for contact plugs decrease substantially after the fabrication of semiconductor device enters 10 nm node and results in increase of resistance. Moreover, the fabrication of contact plugs also requires more masks to be used. The increase of masks further induces an increase in resistance when even a little shift is found in active region and degrades the operation of the device. Hence, how to resolve this issue has become an important task in this field.

SUMMARY OF THE INVENTION

According to a preferred embodiment of the present invention, a method for fabricating semiconductor device is disclosed. The method includes the steps of: providing a substrate having a gate structure thereon; forming a silicon layer on the substrate to cover the gate structure entirely; planarizing the silicon layer; and performing a replacement metal gate (RMG) process to transform the gate structure into a metal gate.

According to another aspect of the present invention, a semiconductor device is disclosed. The semiconductor device includes: a substrate; a first gate structure on the substrate; a first spacer adjacent to the first gate structure; a first contact plug adjacent to the first gate structure and contact the first spacer; and a silicon layer around the first gate structure.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
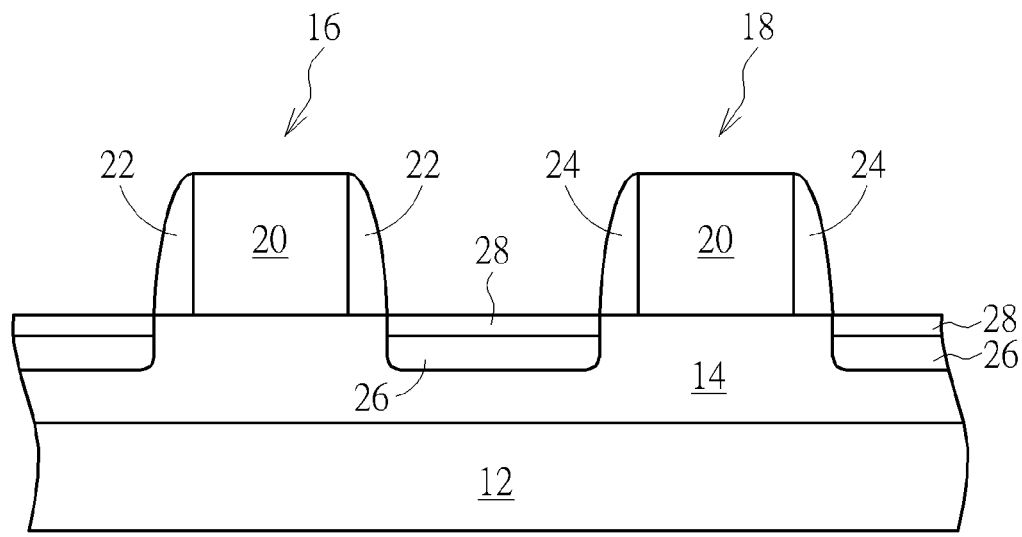
FIGS. 1-6 illustrate a method for fabricating semiconductor device according to a preferred embodiment of the present invention.

Referring to FIGS. 1-6, FIGS. 1-6 illustrate a method for fabricating semiconductor device according to a preferred embodiment of the present invention. As shown in FIG. 1, a substrate 12, such as a silicon substrate or silicon-on-insulator (SOI) substrate is provided, and a transistor region, such as a PMOS region or a NMOS region is defined on the substrate 12. At least a fin-shaped structure 14 and an insulating layer (not shown) are formed on the substrate 12, in which the bottom of the fin-shapes structure 14 is preferably enclosed by the insulating layer, such as silicon oxide to form a shallow trench isolation (STI). A plurality of gate structures 16 and 18 are formed on part of the fin-shaped structure 14. It should be noted that even though two gate structures are disclosed in this embodiment, the quantity of the gate structures is not limited to two, but could by any quantity depending on the demand of the product.

The formation of the fin-shaped structure 14 could be accomplished by first forming a patterned mask (now shown) on the substrate, 12, and an etching process is performed to transfer the pattern of the patterned mask to the substrate 12. Next, depending on the structural difference of a tri-gate transistor or dual-gate fin-shaped transistor being fabricated, the patterned mask could be stripped selectively or retained, and deposition, chemical mechanical polishing (CMP), and etching back processes are carried out to form an insulating layer surrounding the bottom of the fin-shaped structure 14. Alternatively, the formation of the fin-shaped structure 14 could also be accomplished by first forming a patterned hard mask (not shown) on the substrate 12, and then performing an epitaxial process on the exposed substrate 12 through the patterned hard mask to grow a semiconductor layer. This semiconductor layer could then be used as the corresponding fin-shaped structure 14. In another fashion, the patterned hard mask could be removed selectively or retained, and deposition, CMP, and then etching back could be used to form a STI surrounding the bottom of the fin-shaped structure 14. Moreover, if the substrate 12 were a SOI substrate, a patterned mask could be used to etch a semiconductor layer on the substrate until reaching a bottom oxide layer underneath the semiconductor layer to form the corresponding fin-shaped structure. If this means is chosen the aforementioned steps for fabricating the STI could be eliminated.

The fabrication of the gate structures 16 and 18 could be accomplished by a gate first process, a high-k first approach from gate last process, or a high-k last approach from gate last process. Since this embodiment pertains to a high-k first approach, gate structures 16 and 18 composed of high-k dielectric layer and polysilicon material 20 could be first formed on the fin-shaped structure 14 and spacers 22 and 24 are formed on the sidewall of the gate structures 16 and 18. A source/drain region 26 and/or epitaxial layer 28 are then formed in the fin-shaped structure 14 and/or substrate 12 adjacent to two sides of the spacers 22 and 24, and a silicide layer (not shown) could be selectively formed on the source/drain region 26 and/or epitaxial layer 28.

Figure 2:
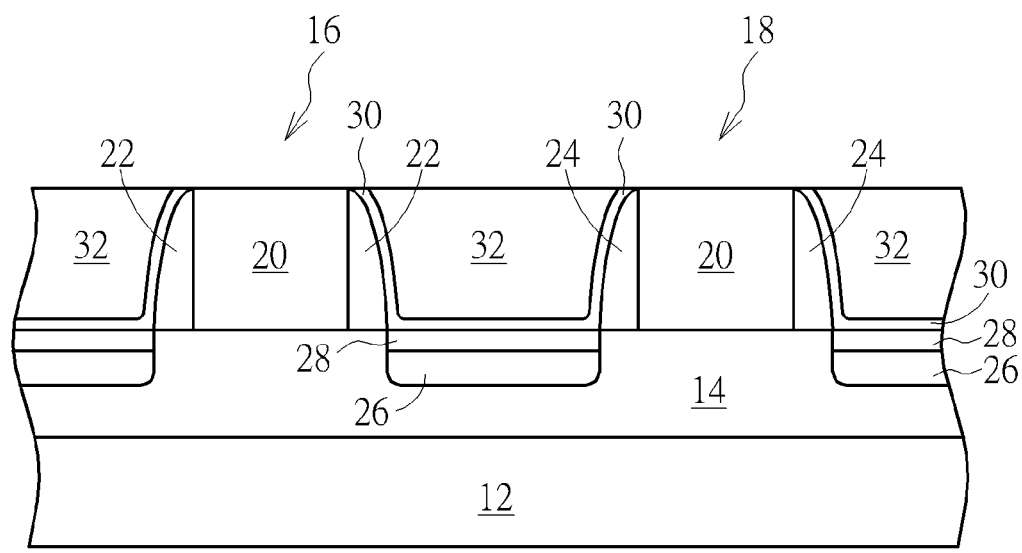
Figure 3:
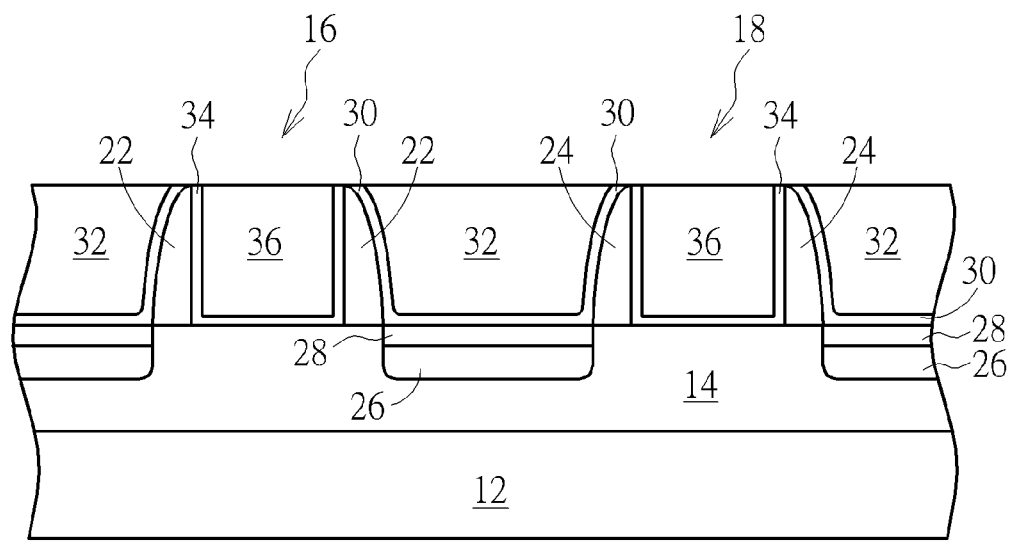

Next, as shown in FIG. 2, a liner 30 could be selectively formed on the substrate 12 gate structures 16 and 18, and a silicon layer 32 is formed on the liner 30 thereafter. Next, a planarizing process, such as CMP is conducted to remove part of the silicon layer 32 and part of the liner 30 so that the top surfaces of the silicon layer 32, liner 30, and gate structures 16 and 18 are coplanar. In this embodiment, the liner 30 could be selected from the group consisting of silicon oxide and silicon nitride, the silicon layer 32 is selected from the group consisting of amorphous silicon, polysilicon, and epitaxial layer, but most preferably amorphous silicon.

Next, a replacement metal gate (RMG) process is conducted to transform the gate structures 16 and 18 into metal gates. The RMG process could be accomplished by first performing a selective dry etching or wet etching process, such as using etchants including ammonium hydroxide ($NH_4OH$) or tetramethylammonium hydroxide (TMAH) to remove the polysilicon material 20 from each of the gate structures 16 and 18 for forming a recess (not shown). Next, a conductive layer including at least a U-shaped work function metal layer 34 and a low resistance metal layer 36 is formed in each recess, and a planarizing process is conducted so that the surfaces of the U-shaped work function layer 34 and low resistance metal layer 36 are even with the surface of the silicon layer 32. Depending on the high-k first approach or high-k last approach being conducted, the cross-section of high-k dielectric layer (not shown) could be either I-shaped or U-shaped.

In this embodiment, the work function metal layer 34 is formed for tuning the work function of the later formed metal gates to be appropriate in an NMOS or a PMOS. For an NMOS transistor, the work function metal layer 34 having a work function ranging between 3.9 eV and 4.3 eV may include titanium aluminide (TiAl), zirconium aluminide (ZrAl), tungsten aluminide (WAl), tantalum aluminide (TaAl), hafnium aluminide (HfAl), or titanium aluminum carbide (TiAlC), but it is not limited thereto. For a PMOS transistor, the work function metal layer 34 having a work function ranging between 4.8 eV and 5.2 eV may include titanium nitride (TiN), tantalum nitride (TaN), tantalum carbide (TaC), but it is not limited thereto. An optional barrier layer (not shown) could be formed between the work function metal layer 34 and the low resistance metal layer 36, in which the material of the barrier layer may include titanium (Ti), titanium nitride (TiN), tantalum (Ta) or tantalum nitride (TaN). Furthermore, the material of the low-resistance metal layer 36 may include copper (Cu), aluminum (Al), titanium aluminum (TiAl), cobalt tungsten phosphide (CoWP) or any combination thereof. Since the process of using RMG process to transform dummy gate into metal gate is well known to those skilled in the art, the details of which are not explained herein for the sake of brevity. According to an embodiment of the present invention, part of the work function metal layer 34 and part of the low resistance metal layer 36 of the gate structures 16 and 18 could be removed to form recess (not shown), and a hard mask (not shown) is filled into each recess so that the surfaces of the hard mask and silicon layer 32 are coplanar. Preferably, the hard mask could be selected from the group consisting of silicon oxide, silicon nitride, silicon oxynitride, and silicon carbon nitride.

Figure 4:
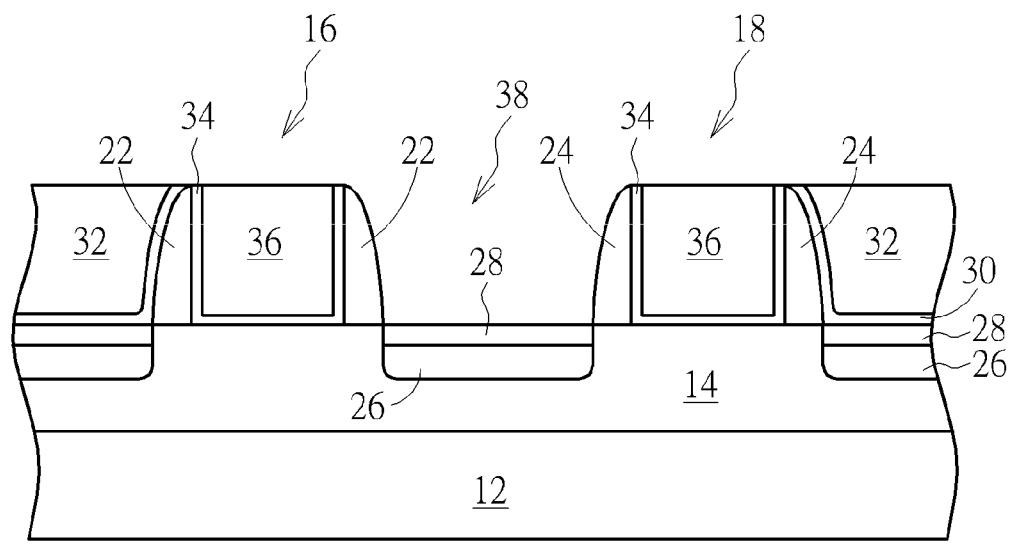

Next, as shown in FIG. 4, a patterned mask (not shown) is formed on the gate structures 16 and 18 to expose the silicon layer 32 between the gate structures 16 and 18, and an etching process is conducted by using the patterned mask as mask to remove the silicon layer 32 adjacent to the gate structures 16 and 18, or more specifically the silicon layer 32 between two adjacent gate structures 16 and 18 for forming a contact hole 38. Preferably, the contact hole 38 completely exposes the spacers 22 and 24 between the two adjacent gate structures 16 and 18.

Figure 5:
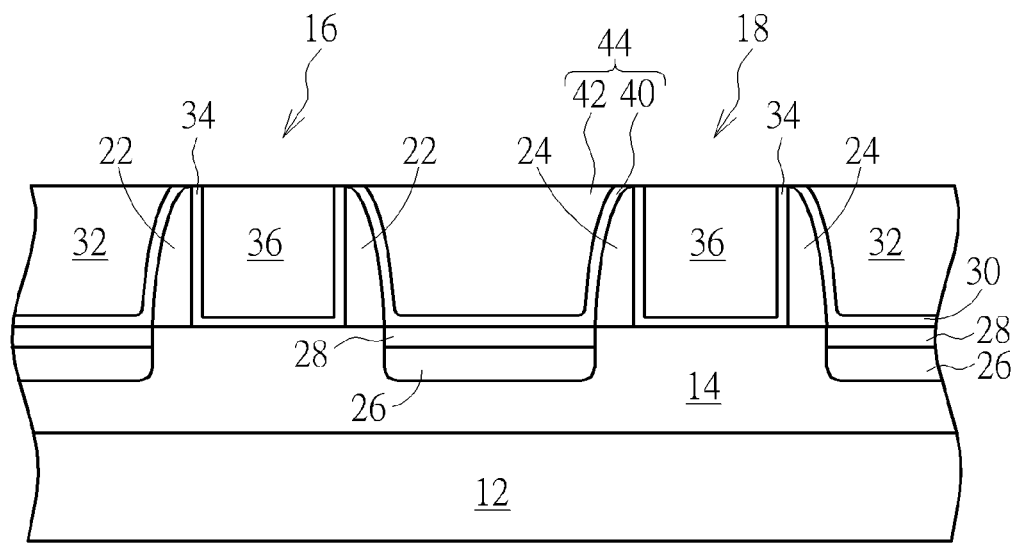

Next, as shown in FIG. 5, a contact plug formation process is conducted by depositing metal materials into the contact hole 38, which could be accomplished by sequentially forming a barrier layer 40 and a metal layer 42 composed of low resistance material into the contact hole 38. The barrier layer 40 is selected from the group consisting of Ti, TiN, Ta, and TaN while the metal layer 42 is selected from the group consisting of W, Cu, Al, TiAl, and CoWP. A planarizing process such as CMP is then conducted to remove part of the barrier layer 40 and part of the metal layer 42 for forming a contact plug 44 in the contact hole 38. The contact plug 44 preferably contacts the spacers 22 and 24 directly and electrically connected to the source/drain region 26 and epitaxial layer 28 in the substrate 12.

Figure 6:
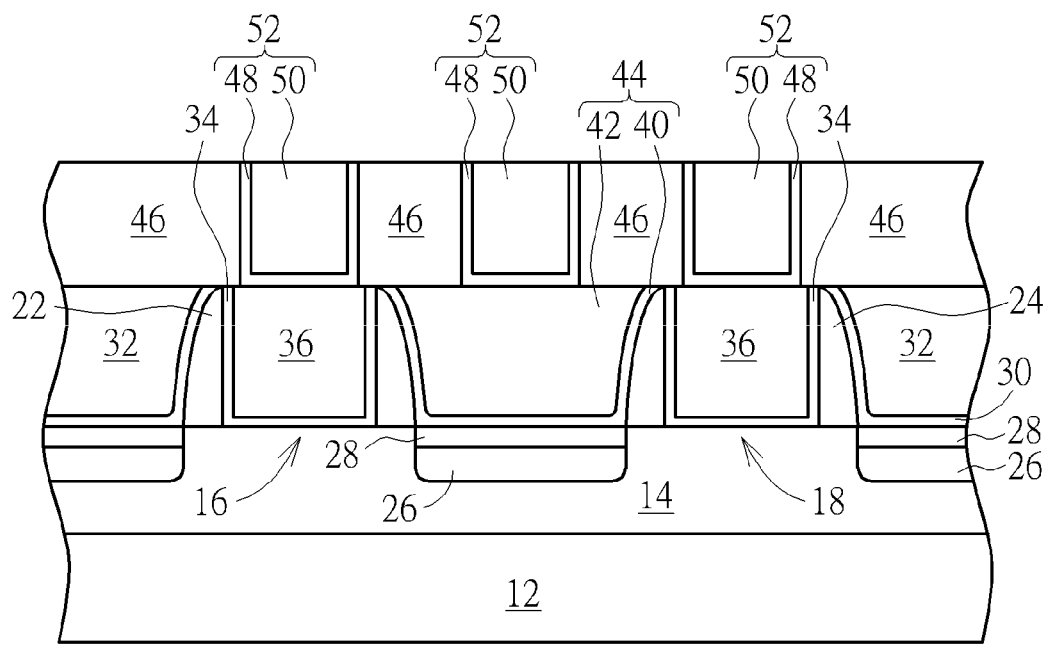

Next, as shown in FIG. 6, an interlayer dielectric (ILD) layer 46 is formed on the silicon layer 32, the gate structures 16 and 18, and on the contact plug 44, and a plurality of contact holes (not shown) is formed in the ILD layer 46, in which the ILD layer 46 and silicon layer 32 are preferably composed of different material. For instance, the ILD layer 46 could be selected from the group consisting of silicon oxide and silicon nitride. Next, a contact formation is conducted to form a plurality of contact plugs 52 composed of barrier layer 48 and metal layer 50 in the ILD layer 46, in which the contact plugs 52 are electrically connected to the gate structures 16 and and the contact plug 44 respectively. This completes the fabrication of a semiconductor device according to a preferred embodiment of the present invention.

Referring again to FIG. 6, which further illustrates a structural view of a semiconductor device according to a preferred embodiment of the present invention. As shown in FIG. 6, the semiconductor device includes a substrate 12, a gate structure 16 and a gate structure 18 on the substrate 12, a spacer 22 adjacent to the gate structure 16, a spacer 24 adjacent to the gate structure 18, a contact plug 44 adjacent to the gate structures 16 and 18 and contacts the spacers 22 and 24 directly, and a silicon layer 32 surrounding the gate structures 16 and 18.

Specifically, the silicon layer 32 is disposed on the left side of gate structure 16, the contact plug 44 is disposed on the right side of gate structure 16, and the contact plug 44 is disposed on the left side of gate structure 18. The contact plug 44 is disposed between the gate structures 16 and 18 while contacting the spacers 22 and 24 at the same time, the sidewalls of the contact plug 44 is totally consisting of the spacers 22 on the left and the spacer 24 on the right, or no other elements such as silicon layer or ILD layer is disposed between the gate structures 16 and 18 except the contact plug 44. In addition, the top surfaces of the silicon layer 32, gate structure 16, gate structure 18, and contact plug 44 are all coplanar. In this embodiment, the silicon layer 32 is preferably composed of amorphous silicon, the contact plug 44 is composed of a barrier layer 40 and a metal layer 42.

A ILD layer 46 is further disposed on the silicon layer 32 and gate structures 16 and 18, and a plurality of contact plugs 52 are formed in the ILD layer 46 to electrically connect the gate structures 16 and 18 and contact plug 44. In this embodiment, the ILD layer 46 and silicon layer 32 are composed of different material. For instance, the ILD layer 46 could be selected from the group consisting of silicon oxide and silicon nitride.

Overall, the present invention first forms at least a gate structure on a substrate, forms a silicon layer preferably composed of amorphous silicon on the substrate and the gate structure, planarizes the silicon layer, uses RMG process to transform the gate structure into metal gate, removes the silicon layer on one side of the gate structure to form contact hole, and then forms a contact plug in the contact hole. This produces a device having silicon layer on one side of the gate structure and contact plug on the other side of the gate structure. By using the aforementioned fabrication process, it would be desirable to reduce the difficulty for fabricating contact plugs as the semiconductor industry enters 10 nm node and beyond and increase the contact area of the contact plug at the same time.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A method for fabricating semiconductor device, comprising:
    providing a substrate having a gate structure thereon;
    forming an epitaxial layer adjacent to two sides of the gate structure;
    forming a silicon layer on the substrate to cover the gate structure entirely;
    planarizing the silicon layer;
    performing a replacement metal gate (RMG) process to transform the gate structure into a metal gate; and
    removing part of the silicon layer adjacent to one side of the gate structure to expose the epitaxial layer after performing the RMG process.

2. The method of claim 1, wherein the silicon layer comprises an amorphous silicon layer.

3. The method of claim 1, further comprising forming a liner on the substrate and the gate structure before forming the silicon layer.

4. The method of claim 3, wherein the liner comprises silicon oxide or silicon nitride.

5. The method of claim 1, further comprising:
    forming a spacer adjacent to the gate structure;
    forming a source/drain region in the substrate adjacent to the spacer; and
    forming the silicon layer to cover the gate structure and the spacer.

6. The method of claim 5, further comprising:
    removing part of the silicon layer adjacent to the gate structure after planarizing the silicon layer to form a contact hole; and
    forming a first contact plug in the contact hole.

7. The method of claim 6, wherein the first contact plug contacts the spacer directly.

8. The method of claim 6, further comprising:
    forming an interlayer dielectric (ILD) layer on the silicon layer, the gate structure, and the first contact plug; and
    forming a second contact plug in the ILD layer and electrically connect to the first contact plug.

* * * * *